US008723217B2

(12) United States Patent
Moon

(10) Patent No.: US 8,723,217 B2
(45) Date of Patent: May 13, 2014

(54) WHITE LIGHT EMITTING DIODE PACKAGE

(71) Applicant: LG Display Co., Ltd., Seoul (KR)

(72) Inventor: Je-Young Moon, Geumsan-gun (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/715,587

(22) Filed: Dec. 14, 2012

(65) Prior Publication Data

US 2014/0034901 A1    Feb. 6, 2014

(30) Foreign Application Priority Data

Aug. 2, 2012 (KR) ........................ 10-2012-0084996

(51) Int. Cl.
*H01L 33/00* (2010.01)
*H01L 31/0203* (2014.01)

(52) U.S. Cl.
USPC 257/99; 257/433; 257/E33.056; 257/E33.057; 257/E33.058; 257/E33.059

(58) Field of Classification Search
USPC ................... 257/99, 433, E33.056, E33.057, 257/E33.058, E33.059
See application file for complete search history.

(56) References Cited

U.S. PATENT DOCUMENTS

| | | | | |
|---|---|---|---|---|
| 5,573,107 A * | 11/1996 | Nakano et al. | ................. | 200/314 |
| 5,841,128 A * | 11/1998 | Shibuya et al. | ............ | 250/208.1 |
| 7,332,746 B1 * | 2/2008 | Takahashi et al. | ............... | 257/98 |
| 8,076,847 B2 * | 12/2011 | Tamaki et al. | ................. | 313/512 |
| 2005/0035364 A1 * | 2/2005 | Sano et al. | ....................... | 257/99 |
| 2008/0123023 A1 * | 5/2008 | Doan et al. | ........................ | 349/70 |
| 2009/0236619 A1 * | 9/2009 | Chakroborty | .................... | 257/89 |
| 2010/0320485 A1 * | 12/2010 | Norfidathul et al. | ............ | 257/88 |
| 2010/0320928 A1 * | 12/2010 | Kaihotsu et al. | ............... | 315/250 |
| 2011/0001148 A1 * | 1/2011 | Sun et al. | ......................... | 257/88 |
| 2011/0012141 A1 * | 1/2011 | Le Toquin et al. | ............... | 257/89 |
| 2011/0176301 A1 * | 7/2011 | Liang et al. | ..................... | 362/231 |
| 2011/0254039 A1 * | 10/2011 | Kim et al. | ........................ | 257/98 |
| 2011/0309388 A1 * | 12/2011 | Ito et al. | ........................... | 257/89 |
| 2012/0020092 A1 * | 1/2012 | Bailey | ....................... | 362/311.02 |
| 2012/0211774 A1 * | 8/2012 | Harada | ............................ | 257/88 |
| 2012/0236582 A1 * | 9/2012 | Waragaya et al. | ............. | 362/510 |
| 2012/0286646 A1 * | 11/2012 | Sakuta et al. | .................. | 313/501 |
| 2012/0305949 A1 * | 12/2012 | Donofrio et al. | ................. | 257/88 |
| 2013/0114242 A1 * | 5/2013 | Pickard et al. | .................. | 362/84 |
| 2013/0208442 A1 * | 8/2013 | Reiherzer | ........................ | 362/84 |

* cited by examiner

*Primary Examiner* — Ida M Soward
(74) *Attorney, Agent, or Firm* — Brinks Gilson & Lione

(57) ABSTRACT

Disclosed is a light emitting diode package having a simplified configuration and high color reproducibility. The light emitting diode package includes a package body, first and second light emitting diode chips received in the package body, a lead frame electrically connected to the first and second light emitting diode chips, the lead frame serving to adjust color of light according to the ratio of current of the first and second light emitting diode chips, and a light conversion layer configured to cover the first and second light emitting diode chips, the light conversion layer serving to convert light emitted from the first and second light emitting diode chips into a particular wavelength of light so as to emit a desired wavelength of light.

10 Claims, 11 Drawing Sheets

WHITE LIGHT EMITTING DIODE PACKAGE

This application claims the benefit of Korean Patent Application No. 10-2012-0084996 filed on Aug. 2, 2012, which is hereby incorporated by reference as if fully set forth herein.

BACKGROUND

1. Field of the Disclosure

The present disclosure relates to light emitting diode packages, and more particularly to light emitting diode packages which achieve not only a simplified circuit configuration, but also high color reproducibility.

2. Discussion of the Related Art

Demands for display devices are gradually increasing with the development of the information age. Accordingly, in recent years, a variety of flat panel display devices, such as a Liquid Crystal Display (LCD), Plasma Display Panel (PDP), Electro Luminescent Display (ELD), and Organic Light Emitting Device (OLED), for example, have been utilized.

Among the aforementioned display devices, a liquid crystal display device displays an image by adjusting light transmittance of liquid crystals using an electric field. To this end, the liquid crystal display device includes a liquid crystal display panel in which liquid crystal cells are provided between a thin film transistor substrate and a color filter substrate, a backlight unit to irradiate light to the liquid crystal display panel, and a drive circuit to drive the backlight unit and the liquid crystal cells.

The liquid crystal display device as described above is not a self-illumination device, and therefore the backlight unit is provided below the liquid crystal display panel. The backlight unit uses, as a light source, a Light Emitting Diode (LED) package, Cold Cathode Fluorescent Lamp (CCFL), Hot Cathode Fluorescent Lamp (HCFL), and External Electrode Emitting Lamp (EEFL), for example.

In particular, the light emitting diode package includes a main body, R, G and B light emitting diode chips mounted in recesses of the main body, lead frames electrically connected to the R, G, and B light emitting diode chips via wires, and a resin material to cover the R, G, and B light emitting diode chips.

As described above, the single light emitting diode package to emit white light includes an R light emitting diode chip that emits red light, a G light emitting diode chip that emits green light, and a B light emitting diode chip that emits blue light. When the R, G, and B light emitting diode chips are mounted in the single light emitting diode package, the number of wires is correspondingly increased and a complicated circuit configuration to apply different currents to the three respective light emitting diode chips is necessary. Moreover, provision of the R, G and B light emitting diode chips causes cost increase.

To solve the aforementioned problems, it is desirable that a light emitting diode package include a single light emitting diode chip and a plurality of fluorescent substances to cover light emitting diodes. This light emitting diode package emits white light via a combination of single wavelength light emitted from the single light emitting diode chip and light emitted from the plurality of fluorescent substances. In this case, although a mixture of the plurality of fluorescent substances is used, the fluorescent substances have a limit to realize high color reproducibility within a wide light emitting wavelength range.

Accordingly, there is a need for a light emitting diode package capable of achieving a simplified circuit configuration and high color reproducibility.

SUMMARY

A light emitting diode package includes a package body, first and second light emitting diode chips received in the package body, a lead frame electrically connected to the first and second light emitting diode chips, the lead frame serving to adjust color of light according to the ratio of current of the first and second light emitting diode chips, and a light conversion layer configured to cover the first and second light emitting diode chips, the light conversion layer serving to convert light emitted from the first and second light emitting diode chips into a particular wavelength of light so as to emit a desired wavelength of light.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EXEMPLARY EMBODIMENTS

Figure 1:
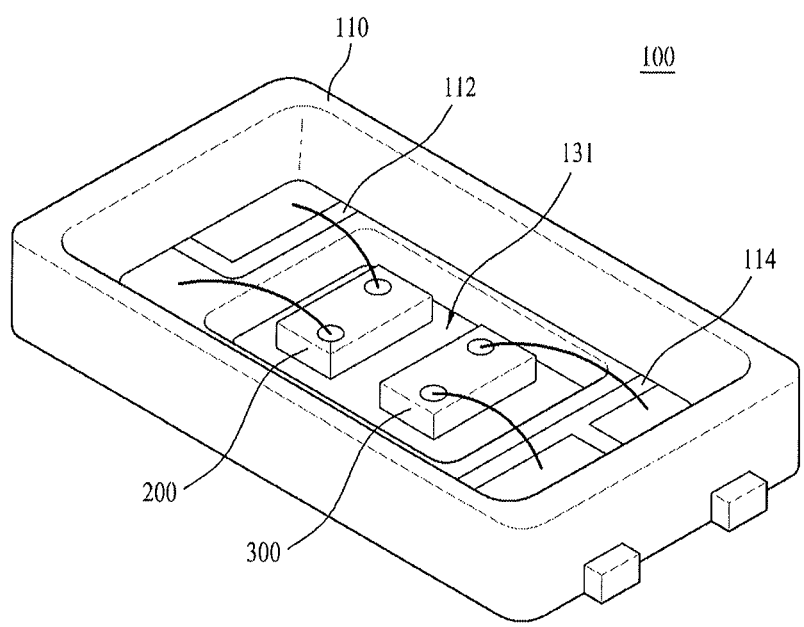
FIG. 1 is a perspective view illustrating a light emitting diode package according to a first embodiment of the present invention.

Hereinafter, embodiments according to the present invention will be described in detail with reference to the accompanying drawings. Configurations and operational effects thereof according to the present invention will be clearly understood by the following detailed description. In the following description, the same or similar elements are denoted by the same reference numerals even though they are depicted in different drawings. In the following description of the present invention, a detailed description of known functions and configurations incorporated herein will be omitted when it may make the subject matter of the present invention rather unclear.

Hereinafter, the exemplary embodiments of the present invention will be described in detail with reference to FIGS. 1 to 10.

Figure 2:
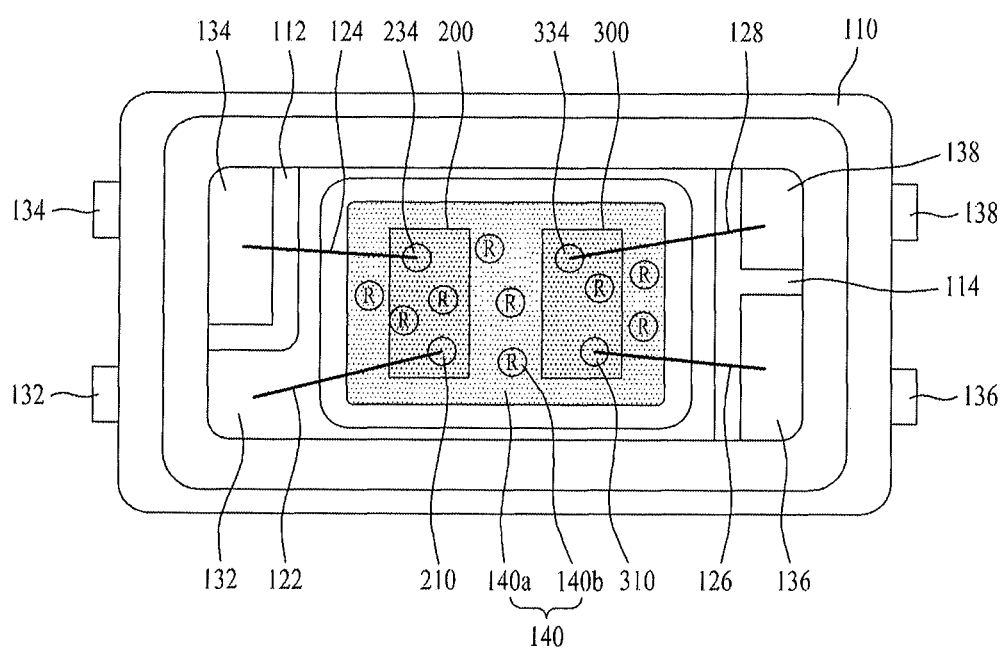
FIG. 2 is a plan view illustrating the light emitting diode package illustrated in FIG. 1.
Figure 3:
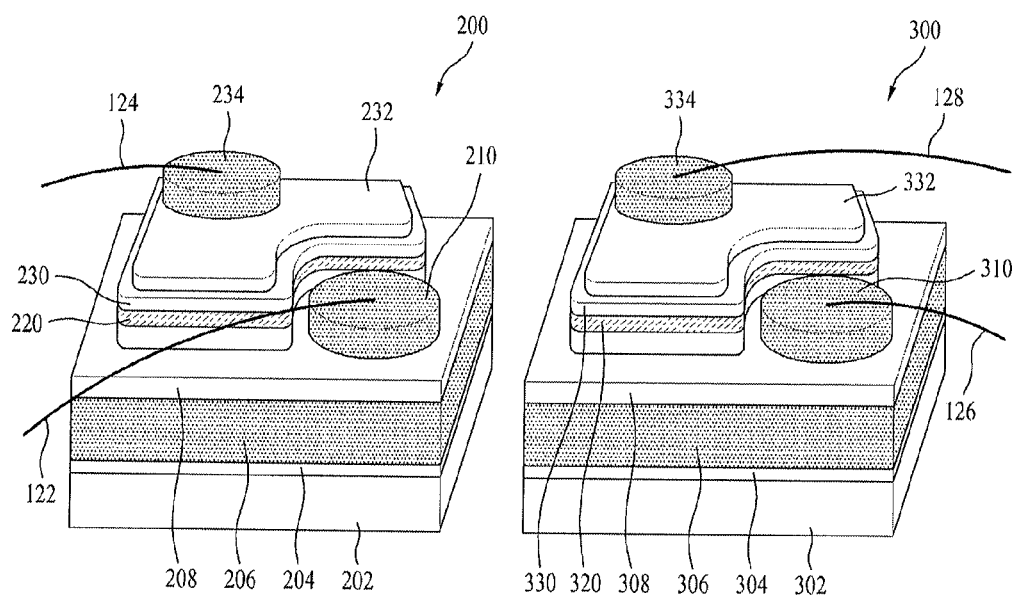
FIG. 3 is a perspective view illustrating first and second light emitting diode chips of the light emitting diode package illustrated in FIG. 1.
Figure 4:
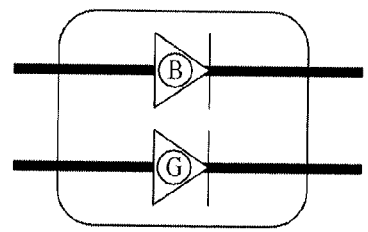
FIG. 4 is a circuit diagram illustrating first and second light emitting diodes of the light emitting diode package illustrated in FIG. 1.

FIG. 1 is a perspective view illustrating a light emitting diode package according to a first embodiment of the present invention, FIG. 2 is a plan view illustrating the light emitting diode package illustrated in FIG. 1, and FIG. 3 is a perspective view illustrating first and second light emitting diode chips of the light emitting diode package illustrated in FIG. 1.

The light emitting diode package according to the first embodiment of the present invention, as illustrated in FIG. 1, includes a package body 110, first and second Light Emitting Diode (LED) chips 200 and 300 received in the package body, a lead frame structure including lead frames 132 to 138 electrically connected to the first and second LED chips 200 and 300 via bonding wires 122 to 128 to adjust color of light according to the ratio of current of the first and second LED chips 200 and 300, and a light conversion layer 140 configured to cover the first and second LED chips 200 and 300, the light conversion layer 140 serving to convert light emitted from the first and second LED chips 200 and 300 into a particular wavelength of light so as to emit a desired wavelength of light.

The package body consists of a cup-shaped sidewall 110 configured to surround the first and second LED chips 200 and 300, a first insulator 112 to electrically isolate the first and second lead frames 132 and 134 from each other, and a second insulator 114 to electrically isolate the third and fourth lead frames 136 and 138 from each other. The sidewall 110 may be coated with a reflective material to enhance reflection efficiency. The package body is formed of an insulating material to electrically isolate the first to fourth lead frames 132 to 138 from one another.

The light conversion layer 140 is configured to cover the first and second LED chips 200 and 300 and enables emission of white light in combination of light emitted from the first and second LED chips 200 and 300.

More specifically, the light conversion layer 140 is configured such that a plurality of phosphors 140b is mixed in a polymer resin 140a, such as silicon-based resin, epoxy-based resin, acryl-based resin, and urethane-based resin. The phosphors 140b include spherical or atypical phosphors capable of emitting a single wavelength or plural wavelengths of visible light, a peak wavelength of which is in a range of about 550 nm to about 660 nm, and which absorb light in a wavelength range of about 430 nm to about 550 nm. Fillers that scatters light or blockers that absorbs UV energy or a particular wavelength range of light may be added to the resin 140a.

The first LED chip 200 emits light in a wavelength range of about 400 nm to about 460 nm, and has a Full Width at Half Maximum (FWHM) of about 10 nm to about 50 nm. As the phosphors 140b are excited by wavelength energy of the first LED chip 200, light of mixed color from the first LED chip 200 and the phosphors 140b has a color coordinate value Cx of 0.130~0.700 and a color coordinate value Cy of 0.03~0.350 in the CIE.1931 coordinate system.

Figure 5A:
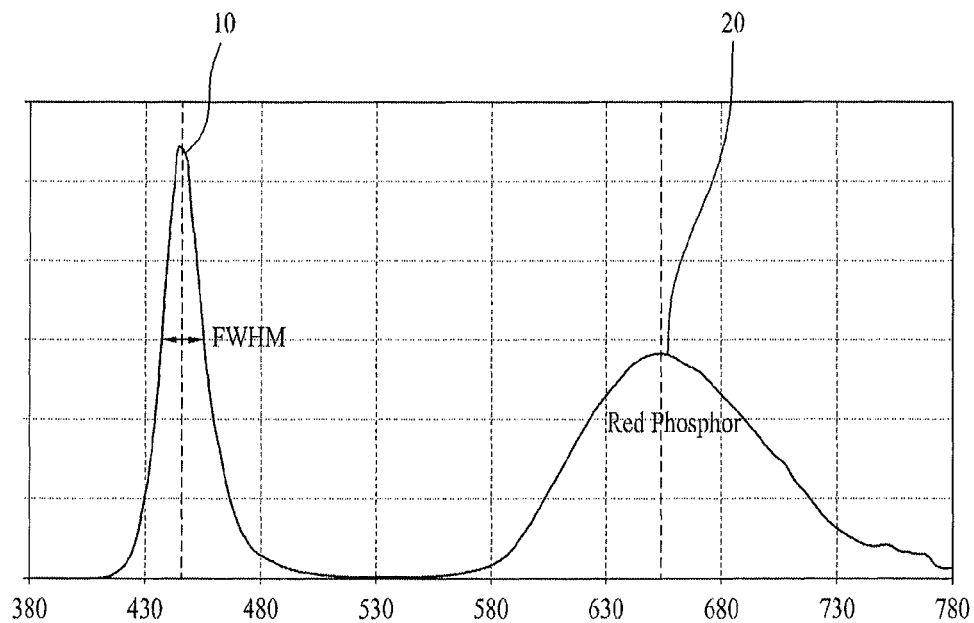
FIG. 5A is a spectral graph illustrating light emission of mixed color of the first light emitting diode chip and phosphors.

More specifically, FIG. 5A is a spectral graph illustrating light emission of mixed color of the first LED chip 200 and the phosphors 140b. In FIG. 5A, the first curve 10 represents light emitted from the first LED chip 200 and the second curve 20 represents a wavelength range of the phosphors 140b excited by wavelength energy emitted from the first LED chip 200. The light of mixed color of the first LED chip 200 and the phosphors 140b, for example, has coordinate values of a point P1 in the CIE.1931 coordinate system illustrated in FIG. 5B.

Figure 5B:
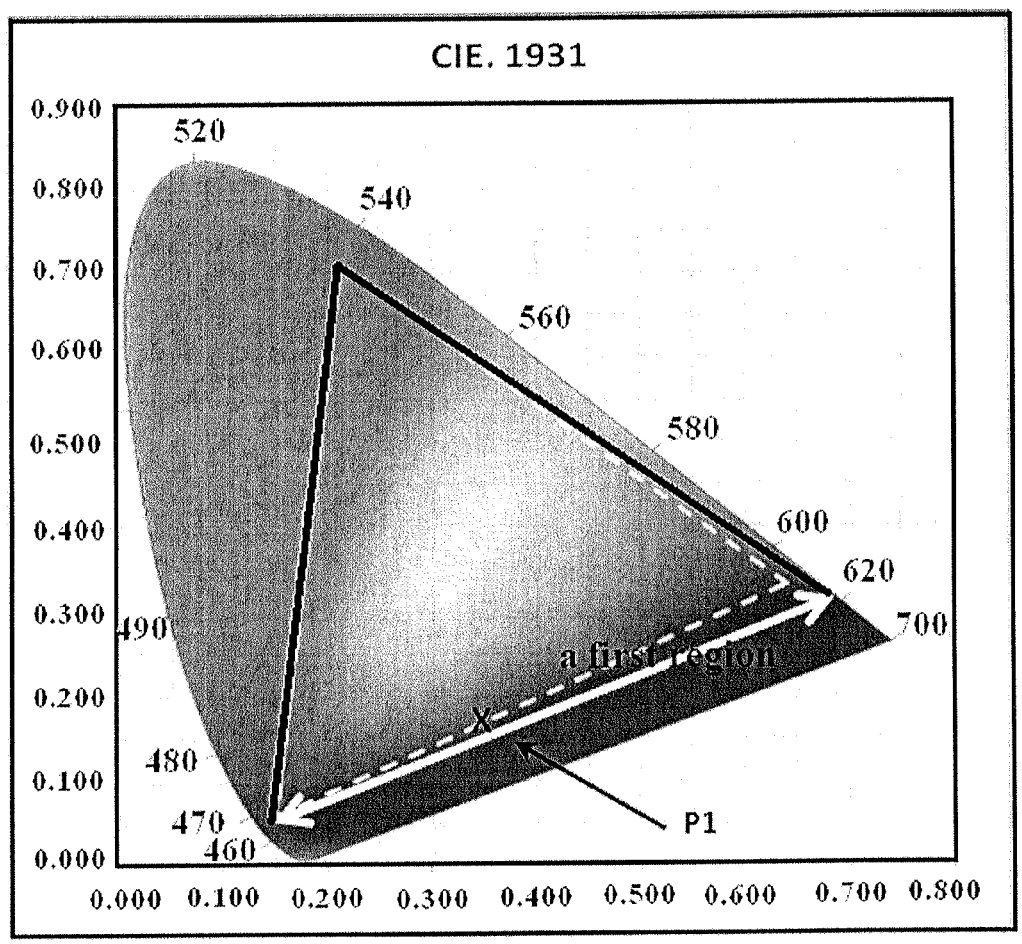
FIG. 5B is a chromaticity diagram of light emission of mixed color of the first light emitting diode chip and the phosphors.

Through combination of the light emitted from the first LED chip 200 and the light emitted from the phosphors 140b, a position of the point P1 within a first region in the CIE.1931 coordinate system illustrated in FIG. 5B may be adjusted. That is, the position of the point P1 within the first region in the CIE.1931 coordinate system may be horizontally shifted by adjusting the number of the phosphors 140b included in the light conversion layer 140 or the wavelength range of the phosphors 140b.

Meanwhile, FWHM refers to the width of a half point of the full wavelength height. Higher color reproducibility can be accomplished as the width of a half point is narrower and the peak of wavelength is pointed sharp at the end. The first LED chip 200 according to the present invention has a FWHM of 10 nm~50 nm suitable to achieve color reproducibility.

The first LED chip 200 includes a substrate 202, buffer layers 204 and 206 formed on the substrate 202, an N-type nitride semiconductor layer 208 formed on the buffer layers 204 and 206, a Multi-Quantum-Well (MQW) active layer 220 formed on the N-type nitride semiconductor layer 208, a P-type nitride semiconductor layer 230 formed on the active layer 220, an ohmic contact layer 232 formed on the P-type nitride semiconductor layer 230 using a transparent conductive material, an N-type electrode 210 formed on and connected to the N-type nitride semiconductor layer 208, and a P-type electrode 234 formed on and connected to the P-type nitride semiconductor layer 230.

The substrate 202 may be a light transmittable sapphire ($Al_2O_3$) substrate. Alternatively, the substrate 202 may be a silicon carbide (SiC) substrate, a GaN substrate, or the like.

The buffer layers 204 and 206 may include a first buffer layer 204 formed on the substrate 202 and a second buffer layer 206 formed on the first buffer layer 204, the second buffer layer 206 being an undoped nitride semiconductor layer. The first buffer layer 204 may be formed of GaN, AlN, AlGaN, InGaN, AlInGaN, or the like to have a predetermined thickness, in order to reduce a lattice constant difference from the substrate 202. The second buffer layer 206 may be an undoped nitride semiconductor layer formed of, for example, undoped GaN. Meanwhile, any one of the first and second buffer layers 204 and 206 may be formed, or the first and second buffer layers 204 and 206 may be omitted.

The N-type nitride semiconductor layer 208 is formed on the second buffer layer 206 by doping a nitride semiconductor layer having a composition of $In_xAl_yGa_{1-x-y}N$ ($0 \leq x \leq 1$, $0 \leq y \leq 1$, $0 \leq x+y \leq 1$) with an N-type conductive dopant. For example, the N-type nitride semiconductor layer 208 is formed by doping a nitride semiconductor layer, which is formed of InAlGaN, GaN, AlGaN, InGaN, or the like, with an N-type conductive dopant.

The P-type nitride semiconductor layer 230 is formed on the active layer 220 by doping a nitride semiconductor layer having a composition of $In_xAl_yGa_{1-x-y}N$ ($0 \leq x \leq 1$, $0 \leq y \leq 1$, $0 \leq x+y \leq 1$) with a P-type conductive dopant. For example, the P-type nitride semiconductor layer 230 is formed by doping a nitride semiconductor layer, which is formed of InAlGaN, GaN, AlGaN, InGaN, or the like, with a P-type conductive dopant.

The N-type electrode 210 is formed on the N-type nitride semiconductor layer 208 and is connected to the first lead frame 132 via the first bonding wire 122. The P-type electrode 234 is formed on the P-type nitride semiconductor layer 230 and is connected to the second lead frame 134 via the second bonding wire 124. Thus, when voltage is applied to the N-type electrode 210 and the P-type electrode 234 through the lead frames 132 and 134, holes and electrons are injected into the P-type electrode 234 and the N-type electrode 210. As extra energy is converted into light through recombination of holes and electrons in the active layer 220, light having a wavelength range of 400 nm~460 nm is emitted outward from the chip.

The active layer 220 is a layer that emits light through recombination of holes and electrons. The active layer 220 adjusts a wavelength band of light by controlling an energy band-gap. The active layer 220 may consist of a pair of a quantum well layer and a barrier layer, such as InGaN/GaN, InGaN/InGaN, InGaN/AlGaN, or InGaN/InAlGaN, and may be an MQW layer.

The second LED chip 300 emits light in a wavelength range of about 460 nm to about 550 nm, and has a FWHM of about 10 nm to about 50 nm. As the phosphors 140b are excited by wavelength energy of the second LED chip 300, light of mixed color from the second LED chip 300 and the phosphors 140b has a color coordinate value Cx of 0.200~0.700 and a color coordinate value Cy of 0.200~0.730 in the CIE.1931 coordinate system.

Figure 6A:
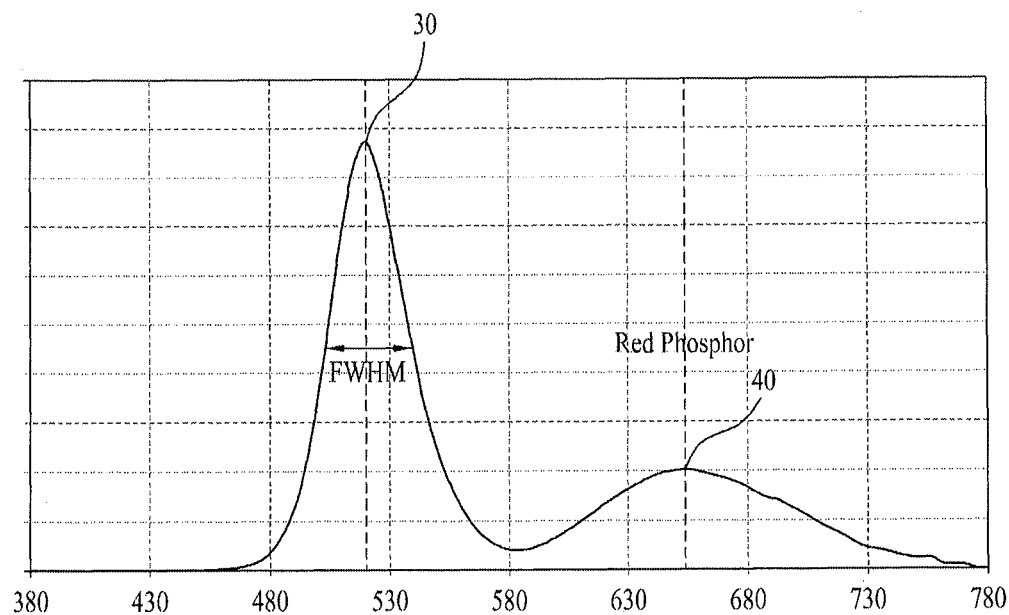
FIG. 6A is a spectral graph illustrating light emission of mixed color of the second light emitting diode chip and phosphors.

More specifically, FIG. 6A is a spectral graph illustrating light emission of mixed color of the second LED chip 300 and the phosphors 140b. In FIG. 6A, the first curve 30 represents light emitted from the second LED chip 300 and the second curve 40 represents a wavelength range of the phosphors 140b excited by wavelength energy emitted from the second LED chip 300. The light of mixed color of the second LED chip 300 and the phosphors 140b, for example, has coordinate values of a point P2 in the CIE.1931 coordinate system illustrated in FIG. 6B.

Figure 6B:
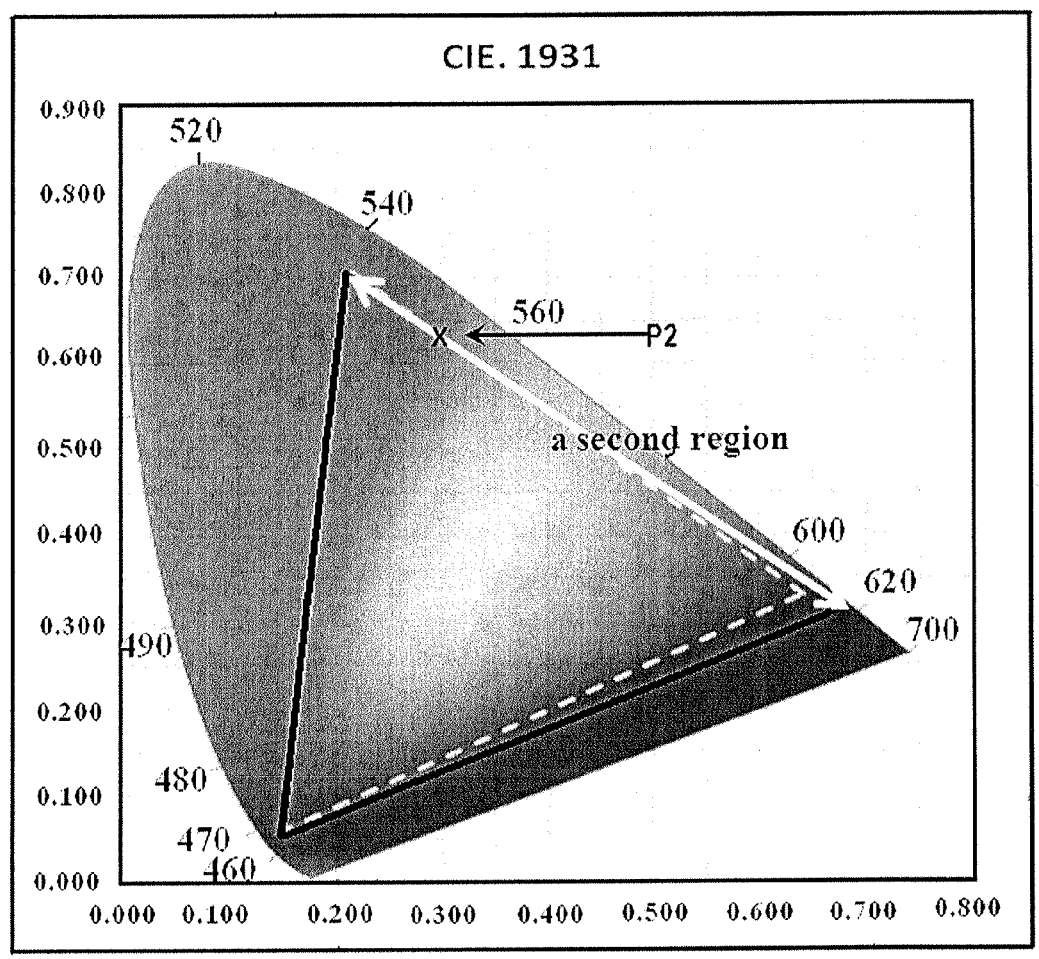
FIG. 6B is a chromaticity diagram of light emission of mixed color of the second light emitting diode chip and the phosphors.

Through combination of the light emitted from the second LED chip 300 and the light emitted from the phosphors 140b, a position of the point P2 within a second region in the CIE.1931 coordinate system illustrated in FIG. 6B may be adjusted. That is, the position of the point P2 within the second region in the CIE.1931 coordinate system may be displaced leftward or rightward by adjusting the number of the phosphors 140b included in the light conversion layer 140 or the wavelength range of the phosphors 140b.

The second LED chip 300 includes a substrate 302, buffer layers 304 and 306 formed on the substrate 302, an N-type nitride semiconductor layer 308 formed on the buffer layers 304 and 306, an MQW active layer 320 formed on the N-type nitride semiconductor layer 308, a P-type nitride semiconductor layer 330 formed on the active layer 320, an ohmic contact layer 332 formed on the P-type nitride semiconductor layer 330 using a transparent conductive material, an N-type electrode 310 formed on and connected to the N-type nitride semiconductor layer 308, and a P-type electrode 334 formed on and connected to the P-type nitride semiconductor layer 330.

The substrate 302 may be a light transmittable sapphire ($Al_2O_3$) substrate. Alternatively, the substrate 302 may be a silicon carbide (SiC) substrate, a GaN substrate, or the like.

The buffer layers 304 and 306 may include a first buffer layer 304 formed on the substrate 302 and a second buffer layer 306 formed on the first buffer layer 304, the second buffer layer 306 being an undoped nitride semiconductor layer. The first buffer layer 304 may be formed of GaN, AlN, AlGaN, InGaN, AlInGaN, or the like to have a predetermined thickness, in order to reduce a lattice constant difference from the substrate 202. The second buffer layer 306 may be an undoped nitride semiconductor layer formed of, for example, undoped GaN. Meanwhile, any one of the first and second buffer layers 304 and 306 may be provided, or the first and second buffer layers 304 and 306 may be omitted.

The N-type nitride semiconductor layer 308 is formed on the second buffer layer 306 by doping a nitride semiconductor layer having a composition of $In_xAl_yGa_{1-x-y}N$ ($0 \leq x \leq 1$, $0 \leq y \leq 1$, $0 \leq x+y \leq 1$) with an N-type conductive dopant. For example, the N-type nitride semiconductor layer 308 is formed by doping a nitride semiconductor layer, which is formed of InAlGaN, GaN, AlGaN, InGaN, or the like, with an N-type conductive dopant.

The P-type nitride semiconductor layer 330 is formed on the active layer 320 by doping a nitride semiconductor layer having a composition of $In_xAl_yGa_{1-x-y}N$ ($0 \leq x \leq 1$, $0 \leq y \leq 1$, $0 \leq x+y \leq 1$) with a P-type conductive dopant. For example, the P-type nitride semiconductor layer 330 is formed by doping a nitride semiconductor layer, which is formed of InAlGaN, GaN, AlGaN, InGaN, or the like, with a P-type conductive dopant.

The N-type electrode 310 is formed on the N-type nitride semiconductor layer 308 and is connected to the third lead frame 136 via the third bonding wire 126. The P-type electrode 334 is formed on the P-type nitride semiconductor layer 330 and is connected to the fourth lead frame 138 via the fourth bonding wire 128. Thus, when voltage is applied to the N-type electrode 310 and the P-type electrode 334 through the lead frames 136 and 138, holes and electrons are injected into the P-type electrode 334 and the N-type electrode 310. As extra energy is converted into light through recombination of holes and electrons in the active layer 320, light having a wavelength range of 460 nm~550 nm is emitted outward from the chip.

The active layer 320 is a layer that emits light through recombination of holes and electrons. The active layer 320 adjusts a wavelength band of light by controlling an energy band-gap. The active layer 320 may consist of a pair of a quantum well layer and a barrier layer, such as InGaN/GaN, InGaN/InGaN, InGaN/AlGaN, or InGaN/InAlGaN, and may be an MQW layer.

The lead frame structure includes a recess 131 providing a space in which the first and second LED chips 200 and 300 are mounted, the first and second lead frames 132 and 134 electrically connected to the first LED chip 200, and the third and fourth lead frames 136 and 138 electrically connected to the second LED chip 300.

More specifically, the first lead frame 132 is connected to the N-type electrode 210 of the first LED chip 200 via the first bonding wire 122, and the second lead frame 134 is connected to the P-type electrode 234 of the first LED chip 200 via the second bonding wire 124. The third lead frame 136 is connected to the N-type electrode 310 of the second LED chip 300 via the third bonding wire 126, and the fourth lead frame 138 is connected to the P-type electrode 334 of the second LED chip 300 via the fourth bonding wire 128. The first and second LED chips 200 and 300 are electrically connected to each other via the bonding wires 122 to 128.

In the light emitting diode package 100 according to the first embodiment of the present invention, the lead frame structure consists of the first to fourth lead frames 132 to 138 such that different values of current or the same value of current may be applied to the first and second LED chips 200 and 300. As such, linear color control in a third region in the CIE.1931 coordinate system is possible according to the ratio of current applied to the first and second LED chips 200 and 300, which results in excellent color reproducibility. That is, high color reproducibility may be achieved by adjusting current to be applied to the first and second LED chips 200 and 300.

Figure 7A:
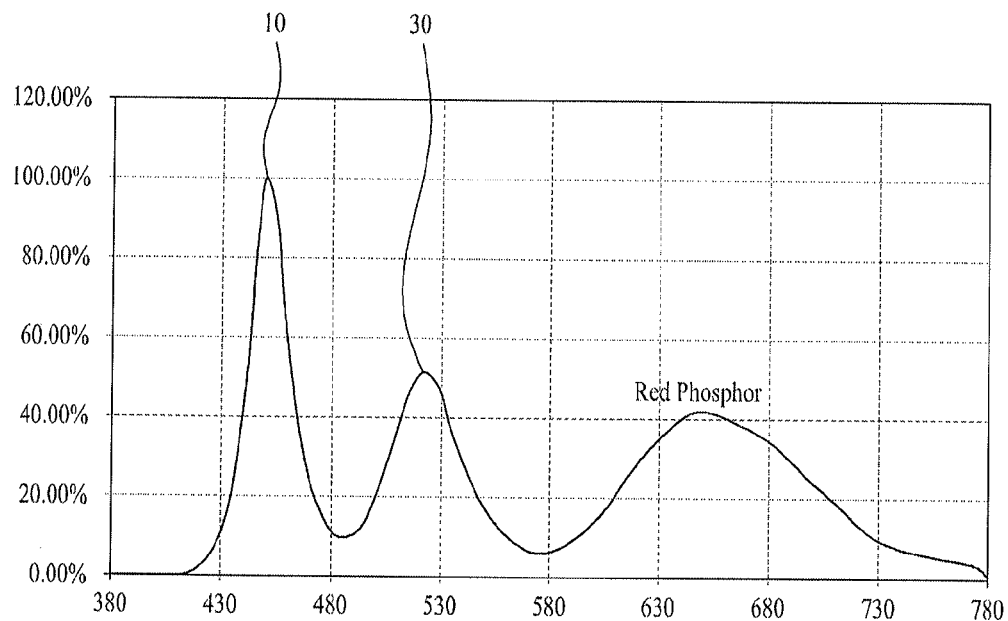
FIG. 7A is a spectral graph illustrating light emission of mixed color of the first and second light emitting diode chips.
Figure 7B:
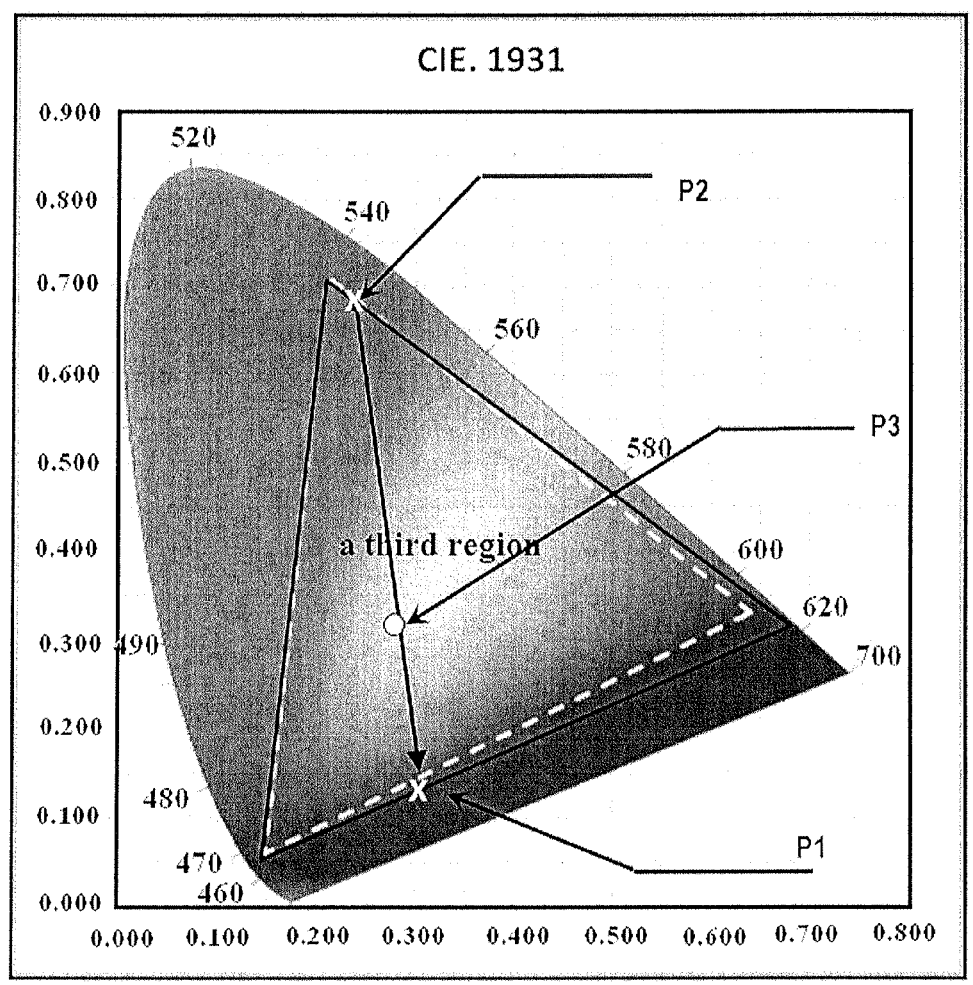
FIG. 7B is a chromaticity diagram of light emission of mixed color of the first and second light emitting diode chips and phosphors.

Operating characteristics of the light emitting diode package according to the present invention will be described hereinafter with reference to FIG. 7B.

First, the first LED chip 200 has operating characteristics in which the phosphors 140b are excited by wavelength energy of the first LED chip 200 and light of mixed color from the first LED chip 200 and the phosphors 140b has a color coordinate value Cx of 0.130~0.700 and a color coordinate value Cy of 0.03~0.350 in the CIE.1931 coordinate system. For example, light of mixed color from the first LED chip 200 and the phosphors 140b exhibits operating characteristics as in the point P1 in the CIE.1931 coordinate system.

The second LED chip 300 has operating characteristics in which the phosphors 140b are excited by wavelength energy of the second LED chip 300 and light of mixed color from the second LED chip 300 and the phosphors 140b has a color coordinate value Cx of 0.200~0.700 and a color coordinate value Cy of 0.200~0.730 in the CIE.1931 coordinate system. For example, light of mixed color from the second LED chip 300 and the phosphors 140b exhibits operating characteristics as in the point P2 in the CIE.1931 coordinate system.

A position of a point P3 in the third region may be vertically shifted by adjusting the magnitude of current of the first light emitting diode chip 200 via the first and second lead frames 132 and 134 and the magnitude of current of the second light emitting diode chip 300 via the third and fourth lead frames 136 and 138. Adjusting the position of the point P3 in the third region realizes color control of light emitted from the light emitting diode package 100. In this way, high color reproducibility can be achieved.

Figure 8:
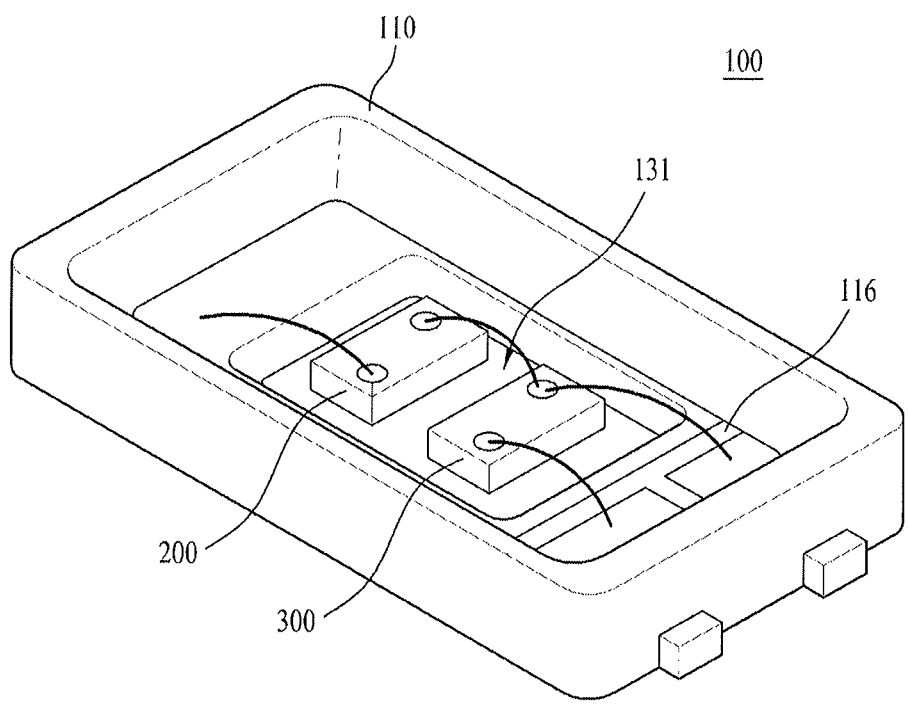
FIG. 8 is a perspective view illustrating a light emitting diode package according to a second embodiment of the present invention.
Figure 9:
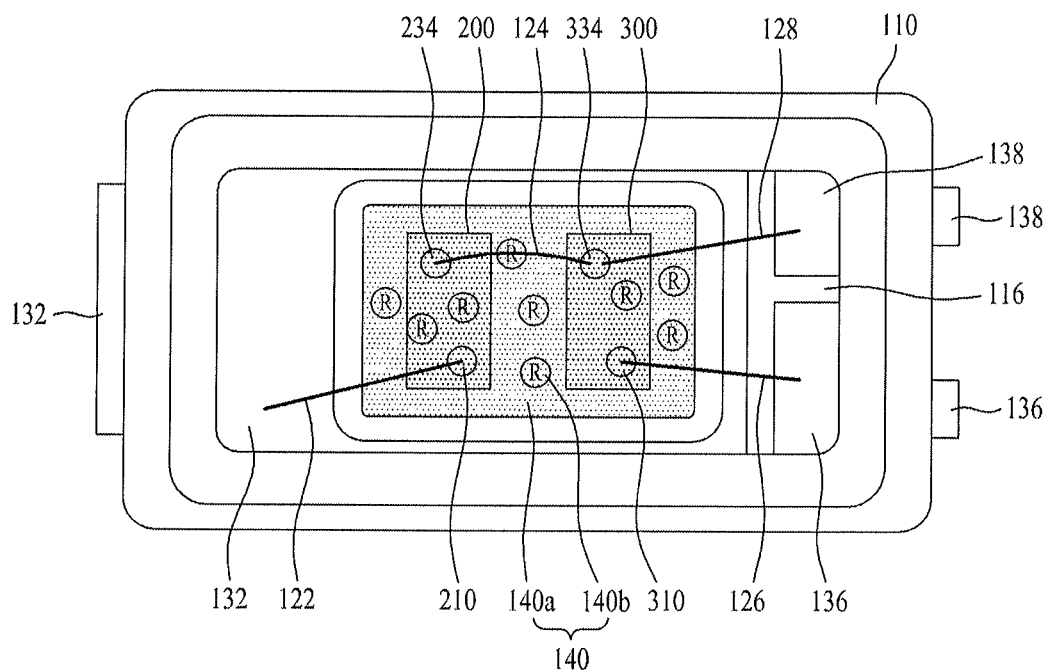
FIG. 9 is a plan view illustrating the light emitting diode package illustrated in FIG. 8.
Figure 10:
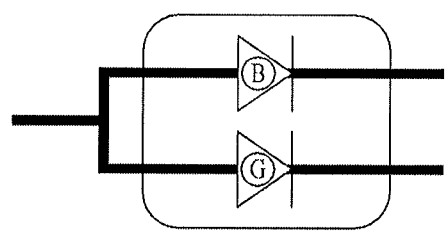
FIG. 10 is a circuit diagram illustrating first and second light emitting diodes of the light emitting diode package illustrated in FIG. 8.

Meanwhile, the light emitting diode package of the present invention, as illustrated in FIG. 2, may be of a 4-pad type in which first to fourth lead frames are provided, or as illustrated in FIG. 9, may be of a 3-pad type in which three lead frames are provided. The 3-pad type light emitting diode package will hereinafter be described with reference to FIGS. 8 and 9.

FIG. 8 is a perspective view illustrating a light emitting diode package according to a second embodiment of the present invention, and FIG. 9 is a plan view illustrating the light emitting diode package illustrated in FIG. 8.

The light emitting diode package according to the second embodiment of the present invention, as illustrated in FIG. 8, includes the package body 110, the first and second LED chips 200 and 300 received in the package body, the lead frame structure including the lead frames 132 to 138 electrically connected to the first and second LED chips 200 and 300 via the bonding wires 122 to 128 to adjust color of light according to the ratio of current of the first and second LED chips 200 and 300, and the light conversion layer 140 configured to cover the first and second light LED chips 200 and 300, the light conversion layer 140 serving to convert light emitted from the first and second LED chips 200 and 300 into a particular wavelength of light so as to emit a desired wavelength of light. In this case, the light emitting diode package according to the second embodiment of the present invention has approximately the same configuration as that of the previously described first embodiment of the present invention except for the package body, the lead frame structure, and the bonding wires, and thus a detailed description of the same configuration will be omitted herein.

The package body 110 consists of the cup-shaped sidewall 110 configured to surround the first and second LED chips 200 and 300, and an insulator 116 to electrically isolate the third and fourth lead frames 136 and 138 from each other. The sidewall 110 may be plated with a reflective material to enhance reflection efficiency. The package body 110 is formed of an insulating material to electrically isolate the third and fourth lead frames 136 and 138 from each other.

The lead frame structure includes the recess 131 providing a space in which the first and second LED chips 200 and 300 are mounted, the first lead frame 132 electrically connected to the first LED chip 200, and the third and fourth lead frames 136 and 138 electrically connected to the second LED chip 300.

More specifically, the first lead frame 132 is connected to the N-type electrode 210 of the first LED chip 200 via the first bonding wire 122, the third lead frame 136 is connected to the N-type electrode 310 of the second LED chip 300 via the third bonding wire 126, and the fourth lead frame 138 is connected to the P-type electrode 334 of the second LED chip 300 via the fourth bonding wire 128. In this case, the P-type electrode 234 of the first LED chip 200 is electrically connected to the P-type electrode 334 of the second LED chip 300 via the second bonding wire 124.

In the light emitting diode package 100 according to the second embodiment of the present invention, the lead frame structure consists of the first to third lead frames such that different values of current or the same value of current may be applied to the first and second LED chips 200 and 300. As such, linear color control in the third region in the CIE.1931 coordinate system is possible according to the ratio of current applied to the first and second LED chips 200 and 300, which results in excellent color reproducibility.

As is apparent from the above description, a light emitting diode package according to the present invention includes first and second light emitting diode chips to emit different wavelengths of light, a light conversion layer including a plurality of phosphors, and a lead frame structure electrically connected to P-type electrodes and N-type electrodes of the first and second light emitting diode chips.

In this case, the lead frame structure is of a 4-pad type in which first to fourth lead frames are provided, or of a 3-pad type in which three lead frames are provided. With this configuration, high color reproducibility may be realized by adjusting color according to the ratio of current of the first and second light emitting diode chips.

Moreover, high color reproducibility may be realized by the first and second light emitting diode chips which emit a narrow wavelength range of visible light.

The light emitting diode package according to the present invention may realize high color reproducibility even using two kinds of light emitting diode chips. Accordingly, as compared to a conventional light emitting diode package including three light emitting diode chips, it is possible to reduce the number of light emitting diode chips and to simplify a circuit configuration according to the reduced number of light emitting diode chips.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A white light emitting diode package comprising:
a package body;
a first light emitting diode chip received in the package body, and the first light emitting diode chip emitting light in a first wavelength range;
a second light emitting diode chip received in the package body, the second light emitting diode chip spaced from the first light emitting diode chip, and the second light emitting diode chip emitting light in a second wavelength range which is different to the first wavelength range;
at least three of lead frames electrically connected to the first and second light emitting diode chips; and
a light conversion layer configured to cover both of the first and second light emitting diode chips, the light conversion layer serving to convert at least part of light emitted from the first and second light emitting diode chips into a third wavelength range which is different to the first and second wavelength range,
wherein the first wavelength range is a range of about 400 nm to about 460 nm, and has a Full Width At Half Maximum (FWHM) of about 10 nm to about 50 nm,
wherein the second wavelength range is a range of about 460 nm to about 550 nm, and has a Full Width At Half Maximum (FWHM) of about 10 nm to about 50 nm,
wherein the third wavelength range is a range of about 550 nm to about 660 nm,
wherein the light conversion layer comprises a resin mixed with a plurality of phosphors, and
wherein the plurality of phosphors include spherical or atypical phosphors which emit a specific single wavelength or plural wavelengths of visible light, a peak wavelength of which is in the third wavelength range, and which absorb light in a wavelength range of about 430 nm to about 550 nm.

2. The package according to claim 1, wherein each of the first and second light emitting diode chips includes:
a substrate;
buffer layers on the substrate;
an N-type nitride semiconductor layer on the buffer layers;
a multi-quantum-well active layer on the N-type semiconductor layer;
a P-type nitride semiconductor layer on the active layer;
a P-type electrode connected to the P-type nitride semiconductor layer; and
an N-type electrode connected to the N-type nitride semiconductor layer.

3. The package according to claim 2, wherein the at least three of lead frames includes:
a recess in which the first and second light emitting diode chips are mounted;
a first lead frame connected to the N-type electrode of the first light emitting diode chip;
a second lead frame connected to the P-type electrode of the first light emitting diode chip;
a third lead frame connected to the N-type electrode of the second light emitting diode chip; and
a fourth lead frame connected to the P-type electrode of the second light emitting diode chip.

4. The package according to claim 3, wherein the package body includes:
a sidewall configured to surround the first and second light emitting diode chips;
a first insulator configured to electrically isolate the first and second lead frames from each other; and
a second insulator configured to electrically isolate the third and fourth lead frames from each other.

5. The package according to claim 1, wherein the first light emitting diode chip has operating characteristics in which the plurality of phosphors are excited by wavelength energy of the first light emitting diode chip and light of mixed color from the first light emitting diode chip and the plurality of phosphors has a color coordinate value Cx of 0.130~0.700 and a color coordinate value Cy of 0.03~0.350 in the coordinate system.

6. The package according to claim 1, wherein the second light emitting diode chip has operating characteristics in which the plurality of phosphors are excited by wavelength energy of the second LED chip and light of mixed color from the second LED chip and the plurality of phosphors has a color coordinate value Cx of 0.200~0.700 and a color coordinate value Cy of 0.200~0.730 in the coordinate system.

7. The package according to claim 2,
wherein the at least three of lead frames includes:
a recess in which the first and second light emitting diode chips are mounted;
a first lead frame connected to the N-type electrode of the first light emitting diode chip;
a third lead frame connected to the N-type electrode of the second light emitting diode chip; and
a fourth lead frame connected to the P-type electrode of the second light emitting diode chip, and
wherein the P-type electrode of the first light emitting diode chip is connected to the P-type electrode of the second light emitting diode chip via a bonding wire.

8. The package according to claim 7, wherein the package body includes:
a sidewall configured to surround the first and second light emitting diode chips; and
an insulator configured to electrically isolate the third and fourth lead frames from each other.

9. The package according to claim 1, wherein the resin includes fillers that scatter light.

10. The package according to claim 1, wherein the resin includes blockers that absorb UV energy or a particular wavelength range of light.

* * * * *